United States Patent [19]

Mojaradi et al.

[11] Patent Number: 5,357,393
[45] Date of Patent: Oct. 18, 1994

[54] INTEGRATED ULTRA LOW LEAKAGE HIGH VOLTAGE PROTECTION CIRCUIT

[75] Inventors: Mohamad M. Mojaradi, Los Angeles; Guillermo Lao, Hawthorne; Dale Sumida, Los Angeles, all of Calif.

[73] Assignee: Xerox Corporation, Stamford, Conn.

[21] Appl. No.: 878,581

[22] Filed: May 5, 1992

[51] Int. Cl.$^5$ .............................. H02H 3/20
[52] U.S. Cl. ..................... 361/56; 361/91; 361/118
[58] Field of Search ............ 257/19, 20, 21; 361/90, 361/91, 117, 118, 56, 58

[56] References Cited

U.S. PATENT DOCUMENTS

| | | | |
|---|---|---|---|
| 3,947,727 | 3/1976 | Stewart | 361/91 |
| 4,027,240 | 5/1977 | Meade | 324/110 |
| 4,061,983 | 12/1977 | Suzuki | 330/207 |
| 4,607,274 | 8/1986 | Yoshitake | 357/42 |
| 4,804,922 | 2/1989 | Sometani et al. | 324/457 |
| 4,990,976 | 2/1991 | Hattori | 357/23 |

Primary Examiner—Marc S. Hoff
Assistant Examiner—S. Jackson
Attorney, Agent, or Firm—Fariba Rad

[57] ABSTRACT

An integrated high voltage device with an ultra low leakage input protection circuit to be used in highly sensitive circuits which require ultra low input leakage current. The protection circuit has a common substrate with the integrated circuit device and the common substrate is floating. The floating substrate provides a way of designing a protection circuit with small diodes which have ultra low input D.C. leakage. The protection circuit includes a resistor and two small Zener diodes which can clamp and protect the device during normal operating conditions up to voltages such as 1700 volts.

10 Claims, 2 Drawing Sheets

INTEGRATED ULTRA LOW LEAKAGE HIGH VOLTAGE PROTECTION CIRCUIT

DESCRIPTION OF THE PREFERRED EMBODIMENT

This application relates to U.S. application Ser. No. 07/878,558, "Electrostatic Voltmeter Employing High Voltage Integrated Circuit Devices" (Common Assignee) and to U.S. application Ser. No. 07/878,651, "An Integrated Linear Ultra High Voltage Device" (Common Assignee), all three Filed concurrently.

It is an object of this invention to provide an ultra low D.C. leakage input protection circuit for an integrated device.

It is also another object of this invention to provide an ultra low D.C. leakage input protection circuit for an integrated device, wherein both the protection circuit and the device can be fabricated on one chip.

Other objects will become apparent from the following description with reference to the drawings wherein.

Figure 1:
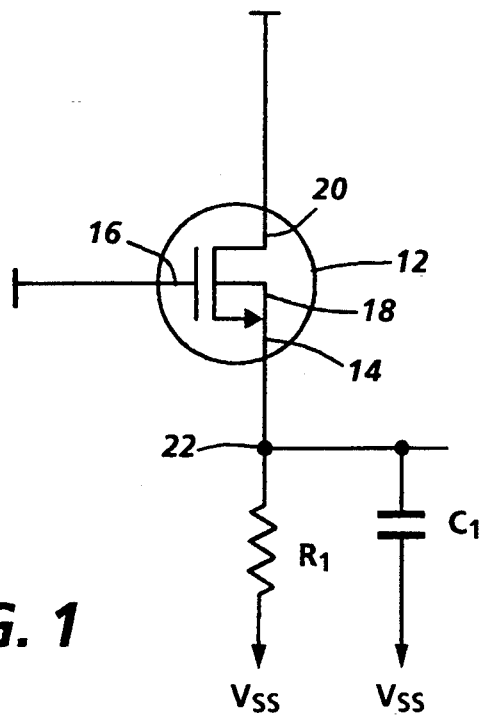
FIG. 1 is a circuit diagram of an integrated linear high voltage device.

Referring to FIG. 1, an integrated linear high voltage device is shown. The source 14 of a high voltage n-channel MOSFET (metal oxide silicon field-effect transistor) 12 is connected to a power supply $V_{SS}$ (substrate power supply) through resistor $R_1$. Hereinafter, where the word transistor is used, it should be assumed that it refers to an n-channel MOSFET. The $V_{SS}$ ranges between 0 volts to $-1700$ volts. The drain is kept at 0 volts with respect to $V_{SS}$. An important feature of this invention is that the substrate 18 of the transistor 12 is "floating". "Floating" as used herein shall mean that the substrate 18 is neither connected to any power supply nor is it grounded. By having the substrate 18 floating, the source 14 can be connected (node 22) to the substrate 18 generating a linear source follower transistor. This configuration takes the transistor 12 into its saturation region which allows the circuit to operate with a gain of approximately 1 over the whole voltage range from zero to $V_{SS}$. This device has a high linearity and high precision. In order to achieve linearity, "bodyeffect" should be eliminated. The "bodyeffect", which is the potential between the substrate 18 of the transistor 12 and the source 14, causes a shift in the threshold voltage of the transistor and increases the nonlinearity. In this configuration, the source 14 of the transistor 12 is connected to its substrate 18, which is floating, to eliminate the bodyeffect.

It is very desirable to obtain optimum linearity. In order to achieve the optimum linearity, it is desirable to use a high voltage resistor $R_1$ which contributes to linearity. In this particular application the preferred resistor is that which is disclosed in U.S. patent application Ser. No. 07/513,697 (D/89093) titled "Thin Film Integrated circuit resistor" (Common assignee), hereby incorporated by reference. The subject integrated resistor eliminates the effect of electric fields associated with the bias voltages of substrate (the substrate bias voltages) on the charge carriers densities within the resistive blocks. This in turn, eliminates and thus provides a resistor that is highly linear.

Even though this device enjoys a high linearity, there is a problem in protecting the transistor at high voltages. When a sudden input voltage is applied to the gate 16 of the transistor 12, the source capacitance $C_1$, which can be modeled between the node 22 and $V_{SS}$, starts charging up. In the worst case, before applying the input voltage, the source voltage, which is connected to the substrate, is at $V_{SS}$. When the source capacitance $C_1$ starts charging up, the source voltage (node 22) starts increasing and in theory the source voltage eventually should rise to a voltage close to the input voltage. However, since the charging rate of the source capacitance $C_1$ is slow the source voltage can not increase to the input voltage rapidly and therefore, initially the voltage difference between the gate 16 and the source 14 can be very large (for instance $-1700$ volts). At this range of voltage difference, the dielectric oxide of the gate 16 ruptures and permanently breaks down which destroys the transistor 12. The breakdown occurs at voltages between 60 to 90 volts. To protect the transistor 12 from destruction in high voltages a protection circuit is needed.

Traditionally, protection circuits have some D.C. input leakage currents. Hereinafter, the D.C. input leakage current is referred to as leakage current. Usually, the leakage current is not a problem in many circuit designs. However, in some sensitive circuit designs such as contacting electrostatic voltmeters, the leakage current is a major problem. In a contacting electrostatic voltmeter, the contacting means should not draw any leakage current. For example, referring to FIG. 2, in a steady state case, when a contacting means 28 contacts the surface of a photoreceptor 30 in a xerographic printer, the contacting means 28 should not disturb the charge pattern of an image on the photoreceptor. If an electrostatic voltmeter with a leakage current contacts a photoreceptor 30, the charges of the image on the photoreceptor will start moving into the electrostatic voltmeter through the leakage current and therefore, the image smears.

To avoid this problem the leakage current should be lowered as much as possible. In highly sensitive circuits such as PH meters or electrostatic voltmeters, there is a great need to lower the leakage input current to a range of picoampere or preferably femtoampere.

The protection circuit of this design overcomes the above problem and has a leakage current in the range of picoampere. The floating substrate 18 of the high voltage transistor 12 is the key element in offering a technique for designing an on chip protection circuit. This is accomplished by utilizing small on chip Zener diodes which have ultra low input leakage current.

The protection circuit 25 of this invention consists of two Zener diodes $D_1$ (30,000 square micron) and $D_2$ (18,000 square micron) with both diodes having a breakdown voltage ranging between 18 V to 25 V. The protection circuit 25 also has a resistor $R_2$ with a resistance ranging between 4 kilohm to 20 kilohm. Resistor $R_2$ is connected between the cathodes of diodes $D_1$ and $D_2$. The cathode of diode $D_1$ is also connected to the input line 26 and the cathode of diode $D_2$ is also connected to the gate 16 of transistor 12. The anodes of diodes $D_1$ and $D_2$ are both connected to the source 14 of the transistor 12. In this configuration, the voltage at the input line 26 can vary between 0 volts to $-1700$ volts and any input voltage beyond the range of $-18$ V to $-25$ V will be clamped by the diodes $D_1$ and $D_2$. Compared to the applied voltage (−1700 volts), the sizes of these Zener diodes are very small. This is made possible due to the floating substrate of transistor 12. Since the source 14 is connected to a floating substrate 18 the voltage difference between the gate 16 and the source 14 can not be more than the Zener break down voltage (18 V to 25 V) of a single diode. Therefore, in this invention two small diodes which can handle a voltage difference in the range of their breakdown voltages (18 V to 25 V) are used. In a conventional transistor where the substrate is connected to $V_{SS}$, and the source is connected to the substrate, the voltage difference between the input with 0 volts and the source voltage would be −1700 volts. To clamp this range and withstand the voltage, larger diodes (100 times larger than the diodes of this embodiment) in a more complicated scheme than the protection circuit 25 would be used to protect the device. It should be understood that larger diodes is referred to diodes with larger junction areas. However, due to the floating substrate of transistor 12, much smaller diodes are used in the design of the protection circuit 25 of this invention. Consequently, the protection circuit is a compact circuit which can be fabricated on one chip with the integrated linear high voltage device.

When any voltage higher than the Zener breakdown voltage (18 V to 25 V), is applied to the input line 26, the diodes $D_1$ and $D_2$ will clamp the input voltage. By applying a high voltage to the input line 26, the source capacitance $C_1$, which is between the floating node (source connected to the substrate) and $V_{SS}$, starts charging up. While the source capacitance $C_1$ is charging up, the Zener diodes $D_1$ and $D_2$ are in their breakdown region. Diode $D_1$, which is larger than diode $D_2$, receives the high input voltage and clamps it down.

Figure 2:
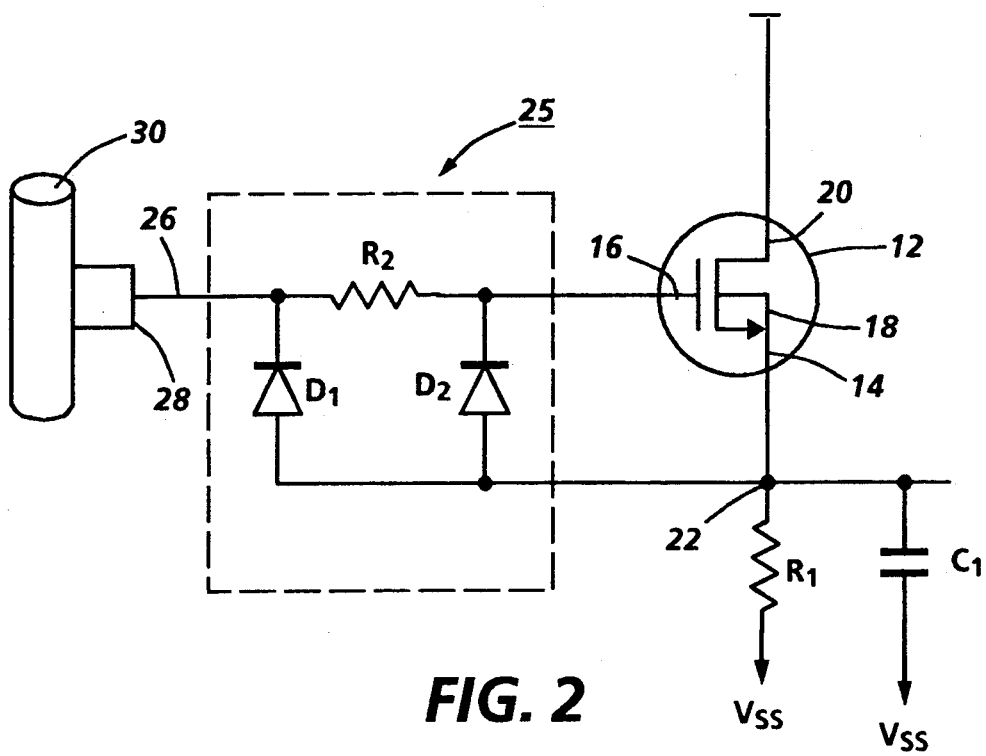
FIG. 2 is a circuit diagram of an integrated linear high voltage device with an ultra low D.C. leakage input protection circuit.

Each diode has a corresponding series resistance. While the diodes are in their breakdown regions, the current passing through the diodes causes a corresponding voltage across the series resistance. The sum total of the breakdown voltage and the voltage drop across the series resistance appears between the two terminals of diodes $D_1$ and $D_2$ as shown in FIG. 2. Diode $D_1$ is designed to have a current in the range of 2 ampere and also has a series resistance ranging between 0 ohm 30 ohm. Diode $D_2$ is designed to have a current no more than 2 miliampere and also has a series resistance ranging between 30 ohm–150 ohm. The current passing through the series resistance of this diode $D_1$ causes a voltage in the range of 100 volts (25 breakdown voltage+75 across series resistance) across the diode $D_1$ which is high enough to destroy the transistor in the absence of resistor $R_2$ and diode $D_2$. By having resistor $R_2$ and diode $D_2$, the current passing through resistor $R_2$ causes a voltage drop across the resistor $R_2$ which in turn lowers the input voltage to the range of 30 volts (25 breakdown voltage+5 across series resistance). This lowered voltage which is applied to diode $D_2$ is still higher than the Zener breakdown voltage and therefore, puts this diode into its breakdown region. Since diode $D_2$ is smaller than diode $D_1$ and diode $D_2$ is clamping a lower voltage, it draws less current. The current passing through the series resistance of diode $D_2$ causes a voltage across this diode which is low enough not to harm the transistor.

The current passes through the diodes $D_1$ and $D_2$ until the source capacitance $C_1$ charges up to a voltage, whereby the difference between this voltage (source voltage) and the input voltage becomes less than the Zener breakdown voltage which in turn turns off the diodes $D_1$ and $D_2$. When the diodes are turned off they have an input leakage current in the range of picoampere. This ultra low leakage current is due to the small size of the diodes used in this design. The leakage current of a diode is proportional to its junction area and the smaller the junction area, the smaller the leakage current. Since in this design much smaller diodes are used, the leakage current is very very low.

The protection circuit, as it is obvious from its name, is designed to protect the device from high input voltages. Once the source capacitance $C_1$ of the device is charged up, the two diodes $D_1$ and $D_2$ will turn off and they stay inactive as long as there is no sudden voltage change in the input voltage or as long as the power to the device is not turned off. For example, in a system such as contacting electrostatic voltmeter, as shown in FIG. 2, initially when the system is turned on, the diodes $D_1$ and $D_2$ start to conduct until the source capacitance $C_1$ charges up and then the protection circuit becomes inactive. After the protection circuit becomes inactive, an image pattern can be sent to the photoreceptor 30 since the leakage current of the protection circuit 25 is ultra low. When the contacting means 28, which is electrically connected to this protection circuit 25 through the input line 26, contacts the photoreceptor 30, it does not draw current to smear the image on the photoreceptor. The protection circuit 25 will stay inactive and does not affect the image on the photoreceptor unless a drastic change on the input voltage occurs due to the malfunction of the system or due to an external factor. At any sudden or drastic change of input voltage the protection circuit 25 turns on to protect the device.

Initially when the system is turned on, if the rate of voltage increase at input is similar to the charging rate of capacitance $C_1$, the protection circuit stays inactive. The inactivation is due to the fact that the voltage of node 22 follows the increase of the input voltage since the capacitance $C_1$ charges up fast. Thus, the voltage difference between the gate and the source of the transistor stays at less than the Zener breakdown voltage of either diodes which keep the diodes inactive. The protection circuit is also inactive during a large change of charge on the photoreceptor since the rate of the change of the charge on the photoreceptor 30 (the rate of the input change of the protection circuit 25) and the rate of the change of the charge of capacitance $C_1$ are similar.

It should also be noted that the integrated linear high voltage device of this invention, disclosed in FIG. 1, can be used in combination with other circuits without a protection circuit for purposes other than high voltage applications or in designs where the voltage can be lowered by some other circuits.

The high voltage nochannel device of this invention, in its present design with 3 micron ultra high voltage CMOS technology, is capable of handling negative voltage differences up to 1700 volts. Since the $V_{SS}$ is at −1700 volts and the input voltage can vary between 0 volts to −1700 volts, the absolute value of the maximum voltage difference is 1700 volts. A p-channel MOSFET with the same geometry of n-channel MOSFET handles positive voltage differences with a lower absolute value. For example, if the $V_{SS}$ for a p-channel MOSFET is +1200 volts, then the input voltage can vary between 0 volts to +1200 volts and therefore, the absolute value of the maximum voltage difference is 1200 volts.

If one desires to use a p-channel MOSFET and be able to handle voltage differences similar to the voltage differences that an n-channel MOSFET handles, regardless of the polarity of the voltage differences, the p-channel MOSFET can be designed with larger geometries. A p-channel MOSFET with larger geometries can handle higher positive voltage differences. It should be understood that the integrated linear high voltage device of this invention disclosed in FIG. 1 utilizes both enhancement and depletion modes of both n-channel and p-channel MOSFETs. Furthermore, It should also be understood that the voltage handling capability of both the n-channel MOSFET and the p-channel MOSFET can be improved by changing the parameters, such as higher resistivity substrate material or lower doping concentration of the junctions, or by using any technology which can produce higher voltage MOS transistors. In this instance the voltage difference handled by either the n-channel MOSFET or the p-channel MOSFET would be substantially beyond ±1700 volts.

Figure 3:
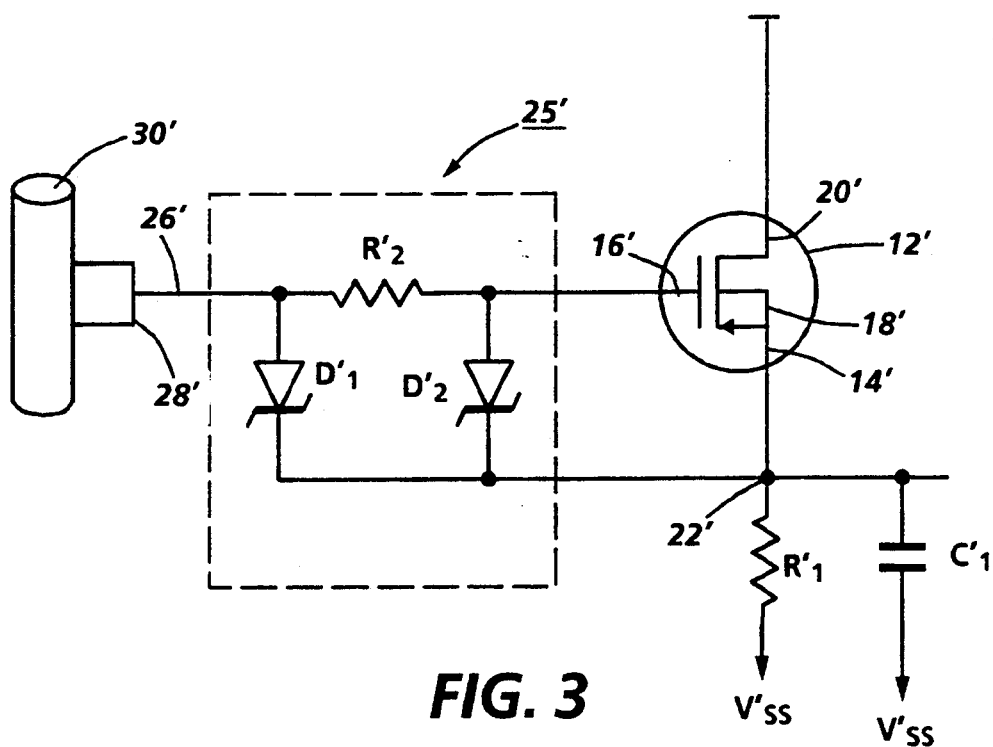
FIG. 3 is a circuit diagram of an integrated linear high voltage device with an ultra low D.C. leakage input protection circuit utilizing a p-channel MOSFET.

FIG. 3 shows an alternative embodiment of this invention using a p-channel MOSFET 12'. Those elements which operate in the same manner as disclosed in the description of FIG. 2 are designated by the same reference numerals, only with a prime (') affixed thereto. As shown in FIG. 3, when a p-channel MOSFET is used, the polarity of the diodes $D_1'$ and $D_2'$ in the protection circuit 25' are reversed. Resistor $R_2'$ is connected between the anodes of diodes $D_1'$ and $D_2'$. The anode of diode $D_1'$ is also connected to the input line 26' and the anode of diode $D_2'$ is also connected to the gate 16' of the p-channel MOSFET 12'. The cathodes of diodes $D_1'$ and $D_2'$ are both connected to the source 14' of the p-channel MOSFET 12'. In this configuration, since the input voltage on line 26' is in the positive range, the diodes $D_1$ and $D_2$ clamp any voltage beyond the range of +18 V to +25 V.

What is claimed is:

1. A high voltage integrated circuit comprising:
   a device;
   said device having an input and a given node;
   a protection means;
   said protection means having a common substrate with said device;
   said common substrate is floating;
   a common input for said protection means and said device;
   said protection means having an output;
   said protection means having a resistor, a first Zener diode and a second Zener diode;
   each of said Zener diodes having a cathode and an anode;
   said cathodes of said first and said second Zener diodes being electrically connected to each other through said resistor;
   said cathode of said first Zener diode being electrically connected to said common input and said cathode of said second Zener diode being electrically connected to said output of said protection means;
   said input of said device being electrically connected to said output of said protection means;
   said common input being electrically connected to said device through said output of said protection means;
   said floating substrate being electrically connected to said given node of said device whereby the voltage applied to said input is followed by said given node of said device and said substrate; and
   said anodes of said first and said second Zener diodes both being electrically connected to said given node of said device for limiting the voltage at said input of said device to a voltage not exceeding the breakdown voltage of said first and said second Zener diodes.

2. The circuit as recited in claim 1, wherein said first diode has a series resistance ranging between 0 ohm to 30 ohm and said second diode have a series resistance ranging between 30 ohm to 150 ohm.

3. The circuit as recited in claim 2, wherein said breakdown voltage is in the range between 18 volts to 25 volts.

4. The circuit as recited in claim 2, wherein an input voltage applied to said input of said protection circuit is between 0 volts to −1700 volts.

5. The circuit as recited in claim 2, wherein an input voltage applied to said input of said protection circuit is between 0 volts to at least −1700 volts.

6. A high voltage integrated circuit comprising:
   a device;
   said device having an input and a given node;
   a protection means;
   said protection means having a common substrate with said device;
   said common substrate is floating;
   a common input for said protection means and said device;
   said protection means having an output;
   said protection means having a resistor, a first Zener diode and a second Zener diode;
   each of said Zener diodes having a cathode and an anode;
   said anodes of said first and said second Zener diodes being electrically connected to each other through said resistor;
   said anode of said first Zener diode being electrically connected to said common input and said anode of said second Zener diode being electrically connected to said output of said protection means;
   said input of said device being electrically connected to said output of said protection means;
   said common input being electrically connected to said device through said output of said protection means;
   said floating substrate being electrically connected to said given node of said device whereby the voltage applied to said input is followed by said given node of said device and said substrate; and
   said cathode of said first and said second Zener diodes being electrically connected to said floating substrate for limiting the voltage at said input of said device to a voltage not exceeding the breakdown voltage of said first and said second Zener diodes.

7. The circuit as recited in claim 6, wherein said first diode has a series resistance ranging between 0 ohm to 30 ohm and said second diode have a series resistance ranging between 30 ohm to 150 ohm.

8. The circuit as recited in claim 7, wherein said breakdown voltage is in the range between 18 volts to 25 volts.

9. The circuit as recited in claim 7, wherein an input voltage applied to said input of said protection circuit is between 0 volts to 1700 volts.

10. The circuit as recited in claim 7, wherein an input voltage applied to said input of said protection circuit is between 0 volts to at least 1700 volts.

* * * * *